(12) United States Patent
Forrest et al.

(10) Patent No.: US 7,829,183 B2
(45) Date of Patent: Nov. 9, 2010

(54) FREE-STANDING SILICON CARBIDE ARTICLES FORMED BY CHEMICAL VAPOR DEPOSITION AND METHODS FOR THEIR MANUFACTURE

(75) Inventors: David Thomas Forrest, Bedford, NH (US); Mark Wallace Schauer, Dublin, NH (US)

(73) Assignee: Morgan Advanced Ceramics, Inc., Hayward, CA (US)

( * ) Notice: Subject to any disclaimer, the term of this patent is extended or adjusted under 35 U.S.C. 154(b) by 347 days.

(21) Appl. No.: 10/581,622

(22) PCT Filed: Dec. 6, 2004
(Under 37 CFR 1.47)

(86) PCT No.: PCT/US2004/040629
§ 371 (c)(1),
(2), (4) Date: Jun. 5, 2006

(87) PCT Pub. No.: WO2005/056873
PCT Pub. Date: Jun. 23, 2005

(65) Prior Publication Data
US 2007/0042153 A1  Feb. 22, 2007

(51) Int. Cl.
*B32B 27/00* (2006.01)
(52) U.S. Cl. ............ 428/212; 428/426; 428/430; 428/437; 428/441; 428/480; 428/483
(58) Field of Classification Search ........... 428/212, 428/426, 430, 437, 441, 480, 483, 698
See application file for complete search history.

(56) References Cited

U.S. PATENT DOCUMENTS

| | | | |
|---|---|---|---|
| 4,582,561 A * | 4/1986 | Ioku et al. ............ 117/56 |
| 4,997,678 A | 3/1991 | Taylor et al. | |
| 5,098,631 A | 3/1992 | Pyzik et al. | |
| 5,604,151 A | 2/1997 | Goela et al. | |
| 5,612,132 A | 3/1997 | Goela et al. | |
| 5,831,367 A * | 11/1998 | Fei et al. ............ 310/216.107 |
| 6,042,758 A | 3/2000 | Goela | |
| 6,066,904 A * | 5/2000 | Fei et al. ............ 310/168 |
| 6,228,297 B1 | 5/2001 | Goela et al. | |
| 6,231,923 B1 | 5/2001 | Teverovsky et al. | |
| 6,464,912 B1 * | 10/2002 | Goela et al. ............ 264/81 |
| 6,515,297 B2 * | 2/2003 | Takeda et al. ............ 257/13 |
| 6,648,977 B2 * | 11/2003 | Goela et al. ............ 118/728 |
| 6,699,411 B2 * | 3/2004 | Odaka et al. ............ 264/29.7 |
| 6,872,637 B2 * | 3/2005 | Pickering et al. ............ 438/483 |
| 6,939,821 B2 * | 9/2005 | Goela et al. ............ 501/88 |
| 2001/0022408 A1 | 9/2001 | Goela et al. | |
| 2002/0004444 A1 | 1/2002 | Goela et al. | |
| 2003/0036471 A1 | 2/2003 | Goela | |
| 2005/0123713 A1 | 6/2005 | Forrest | |

FOREIGN PATENT DOCUMENTS

| | | |
|---|---|---|
| EP | 0 588 479 A1 | 3/1994 |
| EP | 0 676 484 B1 | 10/1995 |
| EP | 0 955 278 A2 | 11/1999 |
| EP | 1 127955 A1 | 8/2001 |
| WO | WO 99/41773 | 8/1999 |

OTHER PUBLICATIONS

Collins, et al., 'Investigation of CVD β-SiC Surfaces Produced via a 'Novel' Surface Replication Process,' *Mat. Res. Soc. Symp. Proc.*, 168:193-198 (1990).
Collins, et al., 'Grain size dependence of the thermal conductivity of polycrystalline chemical vapor deposited β-SIC at low temperature,' *J. Appl. Phys.*, 68(12):6510-6512 (1990).
Goela and Taylor, 'Chemical Vapor Deposition for Silicon Cladding on Advanced Ceramics,' *J. Am. Ceram. Soc.*, 72(9):1747-1750 (1989).
Kim and Zangvil, 'Microstructure Comparison of Transparent and Opaque CVD SiC,' *J. Am. Ceram. Soc.*, 78(6):1571-1579 (1995).
Qadri, et al., 'Characteristics of Plasma Processed SiC Nanocrystallites and Nanorods,' *Applied Physics Letters, American Institute of Physics*, 83(3):548-550 (Jul. 21, 2003).
Kim, Y., et al., "Microstructure comparison of transparent and Opaque CVD SiC", *J. Am. Ceram. Soc.*, vol. 78 (6), pp. 1571-1579, 1995.
Ivanova, L.M., et al., "Thermoelectric properties of vapor-grown polycrystalline Cubic SiC", *Inorganic Materials*, vol. 42 (11), pp. 1205-1209, 2006.

* cited by examiner

*Primary Examiner*—David R Sample
*Assistant Examiner*—Lawrence D Ferguson
(74) *Attorney, Agent, or Firm*—Dean W. Russell; Kristin M. Crall; Kilpatrick Stockton LLP

(57) ABSTRACT

Improved methods for manufacturing silicon carbide rings using chemical vapor deposition. Cylindrical tubes are used as deposition substrates and the resulting material deposited on the inside surface of cylindrical tubes or on the outside surface of cylindrical mandrels, or both, is sliced or cut into the desired ring size and shape. The resulting rings have a crystal growth that is oriented substantially planar to the finished article. The invention also relates to nitrogen doped silicon carbide material, as well as to silicon carbide structures having axes of grain growth substantially parallel to the plane of the structure and to each other, and having rotational orientation that is substantially random with respect to the axes of grain growth of the grains.

15 Claims, 12 Drawing Sheets

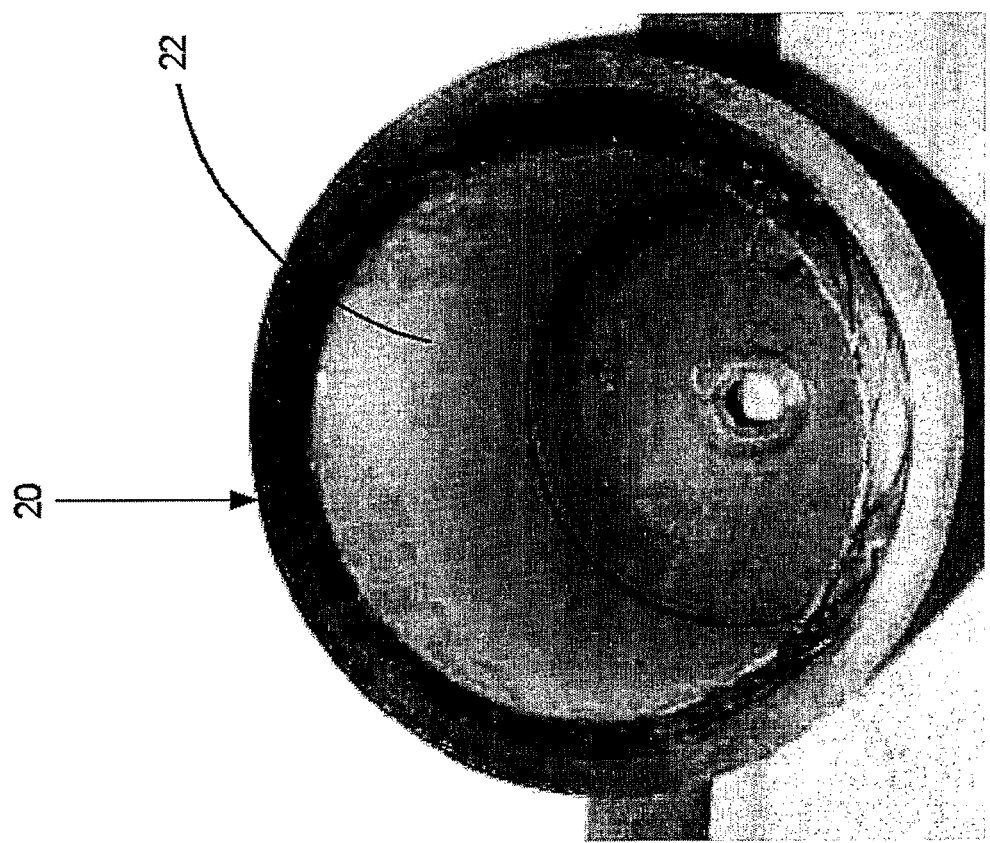

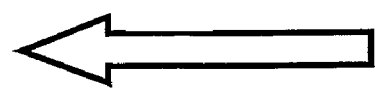
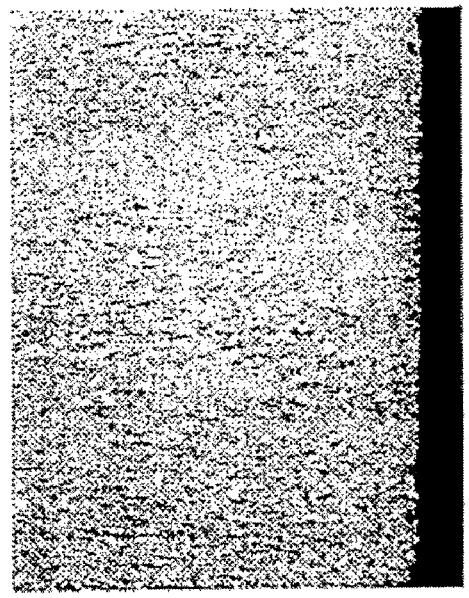
FIGURE 10b
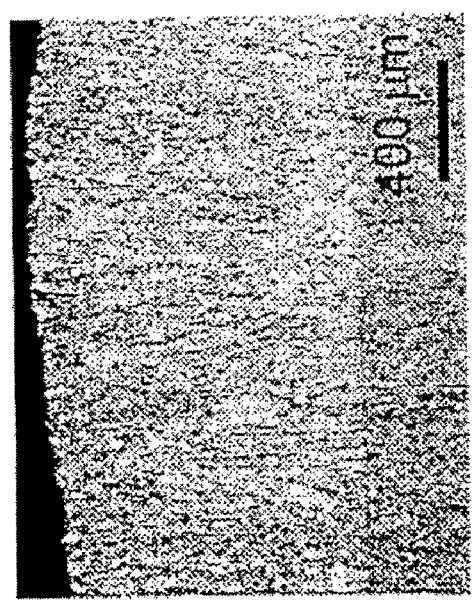
FIGURE 10a

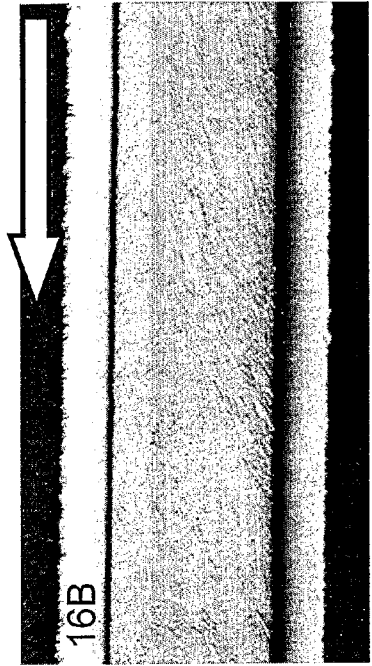
FIGURE 16B
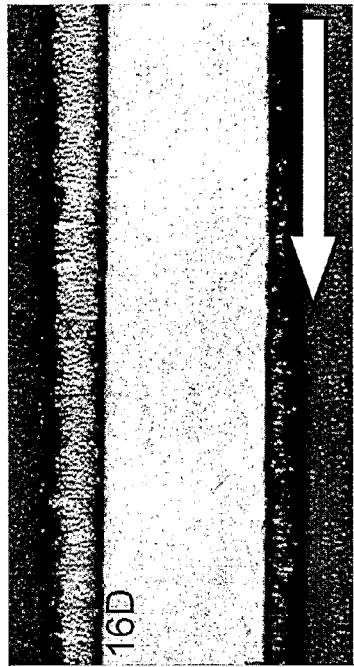
FIGURE 16D
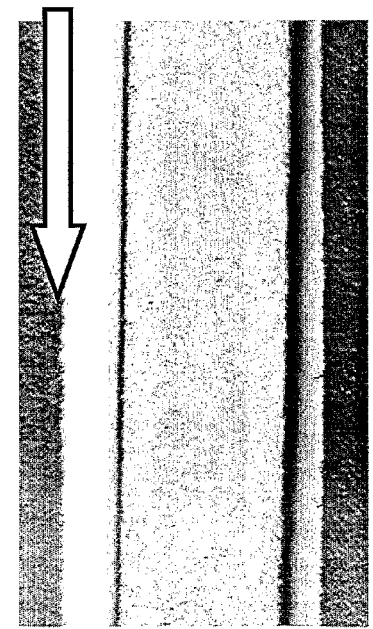
FIGURE 16A
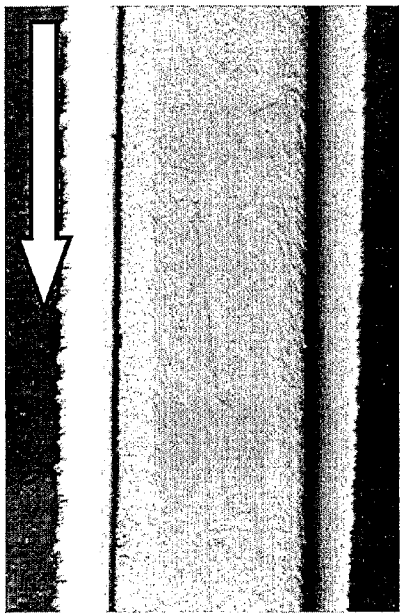
FIGURE 16C
FIGURE 16

FREE-STANDING SILICON CARBIDE ARTICLES FORMED BY CHEMICAL VAPOR DEPOSITION AND METHODS FOR THEIR MANUFACTURE

CROSS-REFERENCE TO RELATED APPLICATION

This application is the U.S. national phase of International Application No. PCT/US2004/040629 filed on Dec. 6, 2004 published in English on Jun. 23, 2005 as International Publication No. WO 2005/056873 A1, which claims priority to U.S. patent application Ser. No. 10/729,262 filed on Dec. 5, 2003, the contents of which are incorporated herein by reference.

BACKGROUND

1. Field of the Invention

The invention relates to articles formed by chemical vapor deposition and methods of forming such articles.

2. Description of Related Art

Chemical vapor deposition (CVD) techniques have been widely used to provide thin films and coatings of a variety of materials on various products. Typically, the process involves reacting vaporized or gaseous chemical precursors in the vicinity of a substrate to result in a material such as silicon carbide (SiC) depositing on the substrate. The deposition reaction is continued until the deposit reaches the desired thickness.

CVD techniques can be used to form relatively thin coatings on the surfaces of pre-existing articles; in this situation, the surface of the article forms the substrate. However, CVD techniques can also be adapted to produce articles that are formed from the deposited material. In this situation, the substrate upon which deposition occurs is a form or mandrel that provides an initial shape to the article. The article, which is removed after sufficient deposition has occurred, has a complementary surface that corresponds to the form or mandrel. Such articles are called "free-standing" articles herein.

One method by which free-standing SiC articles are formed by CVD includes feeding silicon carbide precursor gases or vapors into a deposition chamber, where they are heated to a temperature at which they react to produce silicon carbide. The precursor gases or vapors react at the surface of a substrate or other structure loaded into or placed in the chamber. The silicon carbide builds up as a shell or a deposit on the substrate. Different articles may require different thicknesses, and thicknesses can range from less than 100 microns to over an inch or two inches thick. The thickness can be controlled by controlling the deposition time and/or other process variables. When the desired deposition thickness is reached, the mandrel or substrate is then removed from the deposition chamber and the deposited silicon carbide is separated therefrom.

In one method for forming SiC articles, methyltrichlorosilane ($CH_3SiCl_3$ or MTS), hydrogen ($H_2$), and argon (Ar) gases are introduced into the furnace through an injector. MTS is a liquid at ambient or room temperature, and sufficient vapor can be delivered into the reaction vessel by feeding carrier gas through the MTS liquid or by picking up vapor above the liquid. Gases that are unreacted in the furnace are pumped out by a vacuum pump, filtered, and cleaned in a gas scrubber before being vented to the atmosphere.

Some industries require thinly-formed silicon carbide rings or articles. The current technology of producing monolithic ceramic parts via the chemical vapor deposition process includes producing large sheets of the ceramic material in a CVD furnace. SiC is deposited onto a flat or box-shaped substrate to form the relatively large, flat sheets, from which the final ceramic part or parts are machined. The machining process includes cutting the rough shape out of the large sheet, grinding the piece to near the desired thickness to produce a blank that approximates the final form but with surplus material thickness on each face, and then machining the blank to the dimensions of the final form.

When CVD materials are deposited on large flat substrates, e.g. plates, the material exhibits a direction of crystal growth that is perpendicular to the plane of the flat substrate. The material is not necessarily deposited evenly to form a sheet that is uniform in thickness or in microstructure, so that there may be thicker portions in some areas and thinner portions in other areas, instead of a uniform thickness throughout. Because the as-deposited sheet typically has a thickness profile that is non-uniform, the thickness of rings in rough shape form can vary significantly, depending upon where they were cut from the sheet. Moreover, there may be significant thickness variation within an individual ring in rough shape form.

In addition, due to the large size of the SiC sheet from which the SiC rings are typically formed, different microstructures may exist at different areas of the sheet. For example, when a ring is produced from a sheet of deposited material, differences in the material characteristics across the thickness of the deposited sheet may lead to increased tension or stress within the material that can cause a slight axial bow or curve in the machined ring.

Another manifestation of the different microstructures across the large plate is a variation in cosmetic appearance across the final machined parts, e.g. rings. These variations in cosmetic appearance can be further magnified when the finished parts are coated with other vacuum deposited or vapor deposited coatings, especially CVD deposited coatings such as silicon.

Additionally, because of the thickness variations, the CVD process time must be increased to bring the low deposition rate areas up to the minimum thickness requirements for the desired parts. The higher deposition rate areas then cause the pieces cut from the sheet to require more machining time in order to be ground to the required thickness.

Moreover, there is limited flexibility in the geometry of a sheet and the pieces to be cut, so there is material waste due to the layout pattern of the pieces. There is also surplus material in the piece pattern that is cut or ground from between and within the pieces to make the blanks, such as edges and centers of rings, which results in a large quantity of scrap material. For example, the material that is cut out around each ring and between each ring (to form an inner diameter of the ring) is typically wasted, much like the unused cookie dough remaining after cookies are stamped out from a roll of cookie dough.

There are also occasional problems with cracking of a large, CVD-produced plates or sheets of ceramic material during the CVD process, which can reduce the yield significantly. The combination of cracks and the scrap material from the sheet and the material that is ground from the blanks lowers the average raw material-to-product conversion ratio significantly.

An alternate method that has been used to manufacture silicon carbide rings includes mounting disk-like mandrel substrates through their respective centers in a spaced and parallel relationship in grooves on a shaft. The planar surfaces of the disk-like mandrel substrates are oriented perpendicular to the axis of the shaft. During processing, the shaft is rotated as gases are injected into the chamber, such that ring-shaped ceramic parts are formed by deposition on the mandrel substrates.

A different but related method of creating silicon carbide rings is to suspend within a deposition chamber individual, flat graphite ring mandrels having an outside diameter and an inside diameter similar to those desired in the SiC rings. The gas mixture of MTS in hydrogen and argon is fed into the chamber and silicon carbide is deposited on the mandrels to form rings. Once the rings are removed from the graphite ring mandrels, their inner and outer diameter can be machined to the desired dimensions.

One problem related to forming silicon carbide rings from these alternative processes is that the mandrels need to be rotated throughout the formation process to prevent build-up in undesired areas. In many instances, the gases are injected into the reaction chamber such that the gases are not focused on any particular mandrel or surface of interest, but instead are allowed to deposit non-uniformly on all surfaces of the reactor. The rotation or suspension of the substrate in the reaction gas stream is intended to prevent or limit this non-uniformity of deposition.

The specifically-shaped mandrels are also complicated to manufacture. In the embodiment that includes a shaft with disk-shaped mandrels placed in grooves, the grooves must be specially machined for receiving and supporting the disk-shaped mandrel substrates. In the graphite ring embodiment, each ring support axis must have protrusions or tabs that facilitate their suspension or placement in the chamber, and material is often deposited in or around the protrusions or tabs.

Additionally, in each of the above-described prior art methods, the resulting ring has a crystal growth that is oriented axially relative to the ring or finished article, not radially oriented relative to the ring or article. In other words, in each of the aforementioned prior art methods, the microstructure contains grains having their long direction oriented perpendicular to the plane of the finished part. Further, it is known that as materials are deposited by chemical vapor deposition the size of grains increases as the growth proceeds away from the substrate. The evolution in grain structure from small grains to large grains occurs as grains with lower energy crystallographic orientations grow faster than grains with less preferred orientations, under the particular deposition conditions used. This evolution of grain structure typically produces a gradient in microstructure across the thickness of the material, which in turn causes a gradient in internal stress of the deposited material, resulting in bending or "bow" of the deposited material when it is released from the substrate. This gradient in material microstructure and stress complicates the machining process, and remains in the material even after machining is completed, often resulting in some bow or waviness in the finished part. This bow or waviness is undesirable, especially in parts that require precise tolerances and extremely consistent flatness, such as rings for use in contact with semiconductor wafers. The larger the part, the more significant the problem can become.

Regardless of these difficulties and costs associated with manufacturing silicon carbide articles, silicon carbide has a unique combination of properties that make it a particularly suitable material for a variety of applications in the semiconductor, optical, electronic and chemical processing fields. Silicon carbide articles produced by CVD processing are recognized to exhibit superior chemical, mechanical, thermal, physical and optical properties.

Some semiconductor processing apparatus, such as rapid thermal processing chambers, require the use of thin, SiC-edge rings to support Si wafers during high temperature processing. It is important that these rings be opaque to light, despite being relatively thin, in order to avoid causing irregularities in optical pyrometry temperature measurement of the wafers. Typically, CVD SiC rings are coated with a layer of CVD Si that is 50-100 μm thick to provide the ring with adequate opacity. There is thus a need in the art for a CVD SiC edge ring material that has an optical density closer to single-crystal Si than is possible with standard sheet-form CVD SiC, in order to reduce or eliminate the need for Si coating.

Accordingly, the present inventors have found a way to improve CVD processing for producing articles, in particular planar articles such as rings and discs, and more particularly silicon carbide ring-shaped articles. The resulting articles have a unique microstructural orientation relative to the shape of the article. The invention may also be used to create articles having other shapes. Such articles can be used in fixtures to support silicon and other wafers for processing, susceptor rings for supporting wafers in semiconductor furnaces, and as wafer edge rings.

SUMMARY OF THE INVENTION

The invention provides a structure formed by chemical vapor deposition having a planar direction and a normal direction, wherein the structure has a dimension in the planar direction that is larger than the dimension in the normal dimension and having grains substantially oriented in the planar direction.

The invention further provides improved methods for manufacturing rings using chemical vapor deposition. In particular, the invention provides a method of making such structures by:

a) forming material by chemical vapor deposition on a surface b) dividing the material by slicing along a direction such as will form one or more structures having a dimension in the planar direction that is larger than the dimension in the normal dimension and having grains substantially oriented in the planar direction.

In certain embodiments, tubes (which may be cylindrical) are used as substrates and the resulting material that is deposited on and then removed from the inside or outer surface of the cylindrical tubes can be sliced or cut into the desired ring size and shape. The resulting ring has a diameter in a planar direction and a height in a normal direction. The crystalline grains are oriented in the planar direction, and in certain embodiments, are oriented radially in the planar direction, as opposed to the perpendicular or axial growth orientations seen in the prior art rings. Put another way, the primary direction of crystal growth in materials according to the invention is in the plane of the resulting article; in the case of ring, hoop, or disc shaped articles, the primary direction of crystal growth and grain orientation is in the radial direction.

The invention also relates to methods of forming disk-shaped rings by chemical vapor deposition by (a) providing a round cross-sectional tube in a deposition zone;

(b) directing precursor gas into the tube;

(c) chemically reacting the precursor gas to form a solid deposit in the shape of the tube on the inside on the tube;

(d) removing the solid deposit; and (e) dividing the solid deposit into substantially flat rings.

Alternatively, the solid deposit can be formed on the outer surface of a mandrel disposed in the deposition zone following steps analogous to those described above. The mandrel upon which the outside deposit is formed may also be a tube, so that solid deposit forms on both the inside and outside surfaces of the mandrel, thereby forming two sets of rings of different sizes.

In this respect, the invention is directed to a method of making flat rings by chemical vapor deposition, comprising:
(a) providing in a deposition zone a mandrel having a substantially round cross-section;
(b) directing precursor gas onto the outer surface of the mandrel;
(c) chemically reacting the precursor gas to form a solid deposit approximately in the shape of the mandrel on the outside of the mandrel;
(d) removing the solid deposit; and
(e) dividing the solid deposit into substantially flat rings either before or after removal.

Advantages of this invention include increased space utilization, reduced unit cost of manufacturing the rings, reduced waste during manufacture, and the ability to produce rings of varying diameter, cross-sectional width and thickness depending on the height of cutting (i.e., without varying the deposition time).

The invention is described in more detail below using silicon carbide as a convenient and commercially important example. However, it should be recognized, as it has been by the inventors, that articles according to the invention may be made by practicing the process of the invention using any material that can be deposited by CVD. Illustrative, non-limiting examples include oxide, nitride and carbide ceramic materials including but not limited to aluminum nitride, aluminum oxide, aluminum oxy-nitride, silicon oxide, silicon nitride, silicon oxy-nitride, boron nitride, boron carbide, and other materials such as zinc sulfide, zinc selenide, silicon, diamond, diamond-like carbon, and any other material that can be prepared using CVD techniques.

In addition to allowing production of flat, dimensionally stable rings, the present invention allows for the production of doped SiC rings that have improved opacity, resulting in reduced or minimal light leakage. These rings are particularly suitable for use as support edge rings in semiconductor apparatus that subject Si wafers (and the supporting rings) to high temperature processing such as rapid thermal processing, and for use in other apparatus that are subject to high temperatures.

In this respect, the invention relates to a silicon carbide material, comprising
(a) CVD-deposited silicon carbide; and
(b) about 100 ppm to about 5000 ppm nitrogen dispersed in the CVD-deposited silicon carbide,
wherein the silicon carbide material has an opacity greater than that of CVD-deposited silicon carbide.

The methods described above produce silicon carbide materials containing grains having their growth direction oriented in the plane of the material, and substantially parallel to each other. In addition, the grains preferably exhibit rotational orientation that is substantially random with respect to the axis of grain growth. For materials with cubic crystal structure such as SiC, this results in a random x-ray diffraction pattern when the plane of the part is measured. For non-cubic crystal structure materials deposited by the present invention, it is believed that at least some of the grains are also randomly oriented with respect to the axis of grain growth. The result is a material that is flat, dimensionally stable, uniform in surface appearance, and suitable for coating with silicon layers, if necessary.

In this regard, the invention can be thought of as relating to a planar structure comprising of a CVD deposited silicon carbide material further comprising SiC grains having their axes of growth substantially parallel to each other, and having rotational orientation that is substantially random with respect to the axis of grain growth. Alternatively, the invention relates to a CVD deposited silicon carbide material comprising FCC Moissanite-3C silicon carbide having a 220 to 111 peak ratio between about 0.30 and about 1.25, most preferably between about 0.33 and about 0.60, as measured by x-ray diffraction.

BRIEF DESCRIPTION OF THE DRAWINGS

FIG. 2 is a perspective view of a round cross-sectional tube for use with the CVD apparatus of FIG. 1.

FIGS. 10a and 10b are optical bright field micrographs of etched samples of material made according to one embodiment of the invention.

FIGS. 16a, 16b, 16c and 16d display comparable micrographs showing the microstructure of Si-coated CVD SiC edge rings obtained by the process of the present invention.

DETAILED DESCRIPTION OF SPECIFIC EMBODIMENTS

The largest market for SiC sheet material is the semiconductor market, which uses the high stiffness to weight ratio, chemical and physical compatibility and purity of CVD SiC to make fixtures to support silicon and other wafers for processing. Many of these fixtures are shaped as rings, typically less than 0.2" in thickness and up to about 14" in diameter. The inner diameter is adapted to hold semiconductor wafers.

Although articles made according to the techniques described below are primarily ring-shaped, it is understood that they may have any desired shape, depending upon the size and the shape of the substrate used to form the article. For ease of discussion, however, the below description refers to flat ring-shaped articles and methods of forming the ring-shaped articles using a cylindrical tube as the substrate.

The chemical vapor deposition (CVD) process for silicon carbide (SiC) is generally based upon a thermally induced reaction within a reduced pressure, resistance heated graphite furnace. Certain embodiments of the invention use this equation and these basic parameters:

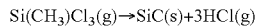

Si(CH$_3$)Cl$_3$(g)→SiC(s)+3HCl(g)

Deposition temperature: 1300-1400° C.
Deposition pressure: ~200 torr
Catalyst: H$_2$ Instead of using flat sided or four sided boxes for deposited material to form a sheet conforming to the dimensions of the sides of the boxes, the invention provides at least one round cross-sectional tube, the internal dimension of which accommodates the outer diameter of the desired ring size. (If a triangular, oblong, oval, octagonal, or any other shaped article is desired, it is also possible to use tubes having the corresponding cross-section, although it is preferred that instead of sharp corners, the substrates have rounded corners and edges to provide a more uniform distribution and to reduce internal stresses.)

Figure 1:
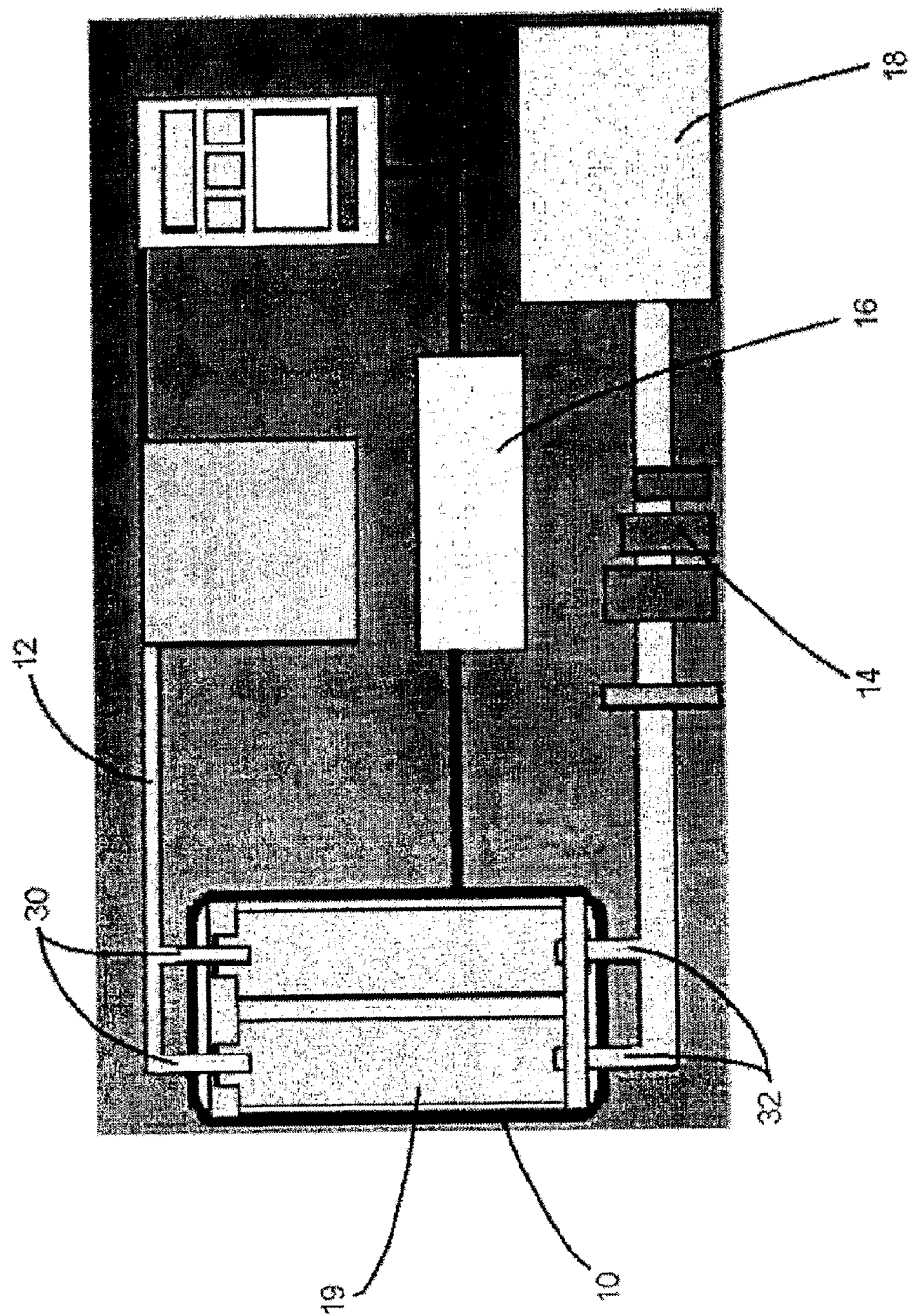
FIG. 1 is a schematic of a CVD apparatus suitable for use in practicing the invention.

The apparatus used in the process of the present invention is a chemical vapor deposition (CVD) chamber designed to deposit ceramic material on the inside of a cylindrical or tubular mandrel. FIG. 1 is a schematic diagram that shows a CVD system that includes a furnace chamber 10, a gas distribution system 12 in fluid communication with the furnace chamber 10, a pumping system 14 in fluid communication with the gas distribution system 12, a power supply 16, and an effluent treatment system 18. The gas is pumped into and out of one or more box substrates 19.

Figure 3:
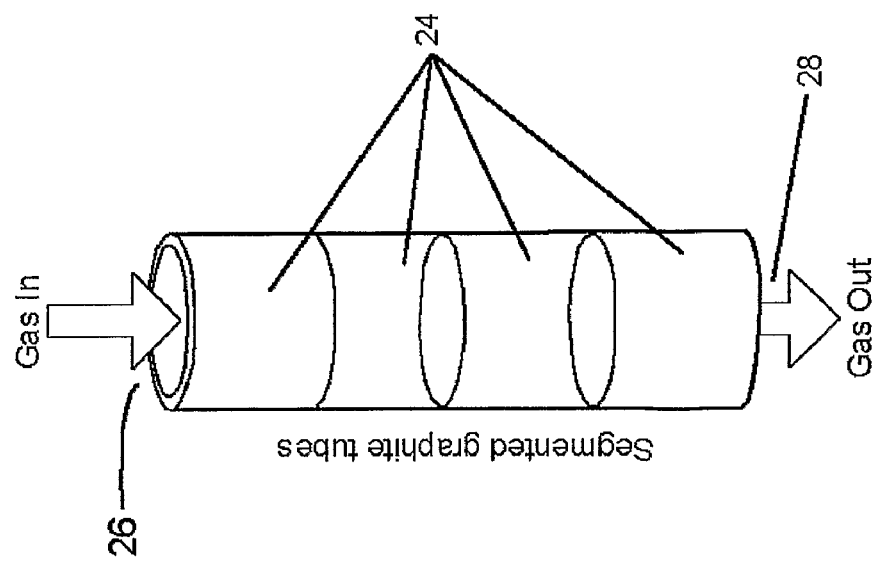
FIG. 3 is a side perspective schematic view of a segmented graphite tube showing the gas injection flow through the tube.

In this embodiment, the invention uses as a substrate a round or circular cross section cylindrical tube 20, as shown in FIGS. 2 and 3. The cylindrical tube 20 is typically mounted in a vertical direction in the chamber 10, although it could be mounted at any other angle.

In use, reactant gas is admitted at an injector (shown schematically at 30 in FIG. 1) at the top of chamber 10 (although it could alternatively or additionally come in from the bottom) and into cylindrical tube 20. The gas is removed by an exhaust port (shown schematically at 32) at the bottom of chamber 10 (although it could be at the top) which connects to the pumping system 14 and effluent treatment system 18.

In this embodiment, the cylindrical tubes 20 in FIG. 2 are preferably graphite tubes that are attached in a non-rotating manner in chamber 10. Cylindrical tubes 20 may be attached such that they are allowed or caused to rotate, but rotation is not required and is typically not employed.

The graphite cylindrical tubes 20 have a substantially round cross-section, such that the material deposited on the inside of the tubes is formed in a corresponding round cross-sectional shape. The circular radius of cylindrical tubes 20 allows uniform distribution and flow of gases. A release coating or other substance may be applied to the inner surface of the graphite tube to facilitate removal of the CVD deposited SiC material.

A cylindrical tube 20 that forms the substrate for the deposition process is shown in FIGS. 2 and 3. Tube 20 can be a single, full length tube, or it may be a series of tube sections 24 as shown in FIG. 3. If the tube is graphite, which is typically used for the SiC CVD process, a full length tube will be quite heavy and difficult to work with. Thus, one option is to provide a tube that is actually a series of tubes, for instance, four or five tubular sections, that can be attached with a joining fixture. Because the resulting deposit that is formed will be sliced or otherwise sectioned, the joints between the tube sections need not be seamless. In fact, the joining fixture may be a device that provides an indentation between the tube segments that acts as a deposition inhibitor so that the tube segments can be readily separated from one another. While any length of tube or the segments can be used, in certain embodiments, the tube segments 24 are about twelve inches high and about three to six segments are attached to one another, yielding a cylindrical silicon carbide deposit that is about 40 to about 60 inches high.

The tube 20 can have the same cross-sectional dimensions throughout, or the cross-section can be varied. For example, if the deposition tends to be greater at certain areas of the cylinder than at others, the geometry of the cross-section can be varied to accommodate those deposition variations. The cylinder can also be tapered if differently-shaped disks are desired. Alternatively, the cylinder can be terraced or stepped to provide clear divisions between the sections.

During processing, precursor gas is fed into the internal diameter of the cylindrical tube 20 in order to make a tubular monolith of CVD deposited material, such as a ceramic material. In the illustrated embodiment, gases are fed at the top of the chamber through injector 30 and exhausted at a manifold or exhaust port 32 at the bottom of the chamber. Each of the cylindrical tubes 20 has a dedicated, independent injector or precursor gas feed positioned so that the gas enters at one end 26 of cylinder and exits through the other end 28. This allows deposition primarily on the surfaces of interest only, the internal diameter 22 of the tube 20, and not on other surfaces, such as the outside of the cylindrical tube 20. The gas travels in a path along the axis of the tube. This provides a more efficient deposition process by allowing better control of gas conditions. The only asymmetry in thickness that may arise is a thickness gradient from the top to the bottom of the tube, although the thicker areas can be machined to the proper thicknesses.

Figure 7:
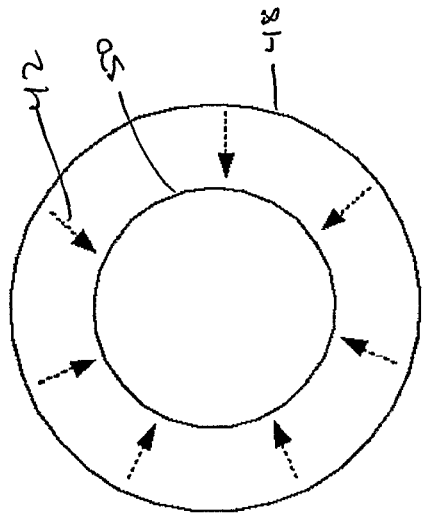
FIG. 7 is a top view schematic showing the crystal growth of a flat ring formed by the methods of present invention.
Figure 6:
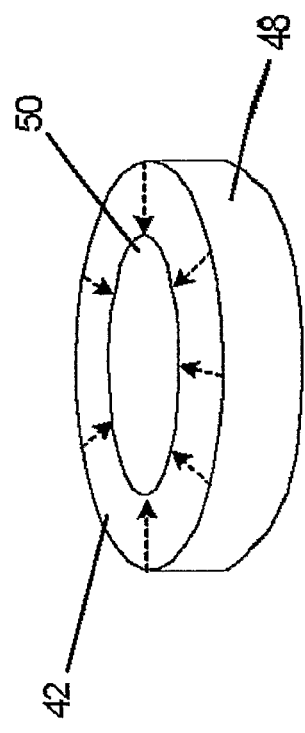
FIG. 6 shows the crystal growth of a ring formed by the methods of present invention.

In certain specific embodiments, the gas feed is a linear, symmetrical chemical vapor deposition system with reaction gas entering the chamber approximately at the center of the diameter such that the gas is deposited substantially evenly along the inside surface 22 of the tube 20. The reaction product is deposited to a set thickness on the internal surface. The SiC builds up on the inner surface of the tube in a substantially radial direction, as shown by FIGS. 6 and 7.

This process is more efficient than the prior art process in which reaction products are deposited throughout the chamber and not at specific locations. The cylinder also does not need to be rotated in order to obtain the desired uniform deposition in a consistent manner, in contrast to many methods of the prior art, although it could be rotated if desired.

Typically, the deposition thickness is approximately 1 inch, although a wide range of material thickness from approximately 0.1 inch to over 2 inches may be obtained by varying gas flow rates and deposition times. Gases from multiple tubes may be evacuated commonly from the chamber though exhaust port 32.

Once the silicon carbide has been deposited on the inside of the tubular mandrel, the deposit is removed from the mandrel by any appropriate technique, including, but not limited to grinding or electrical discharge machining.

Figure 4:
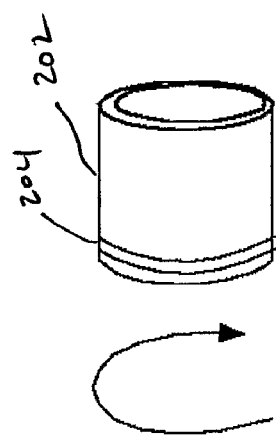
FIG. 4 is a schematic view of the material formed by deposition on the inside of the tube of FIGS. 2 and 3 as it is being sliced.

The resulting SiC tube 202 can be cut through the circular cross section to yield a ring or a hoop 204, as shown in FIG. 4. Cutting can be accomplished by using ceramic machining techniques including, but not limited to, diamond slicing, ultrasonic cutting or laser cutting. In the case of using an electrically-conductive deposited material, electrical discharge machining can be used to slice rings from the tubular section.

Rings of varying diameter can be produced by varying the cross-sectional width and thickness of deposition to give the desired internal diameter. Overall height of the ring can be adjusted by varying the height of cutting.

The outer diameter of the ring or hoop 202 will correspond to the inner diameter of the cylindrical tube 20 and the inner diameter of the ring or hoop will depend upon the amount of gases that are fed through the tube and allowed to deposit. The thicker the deposit, the smaller the inner diameter of the ring that can be produced. The diameters of the ring may then be machined, smoothed or otherwise shaped to provide the desired dimensions.

In an alternative embodiment, a SiC tube can be formed by depositing the material on the outside of a cylindrical mandrel, again by CVD. In this case, a release coating or other substance may be applied to the outer surface of a tubular graphite mandrel to facilitate removal of the CVD deposited SiC material. When the deposit reaches the desired thickness, the mandrel can be removed and the resulting annular SiC cylinder can be sectioned as described herein. It is believed that the same or similar stress distribution properties as are obtained for deposition on the inside of the tube will be obtained using this alternative method, namely, that the stress distribution pattern will be radially symmetric, leading to enhanced dimensional stability in rings cut from this material.

Figure 8:
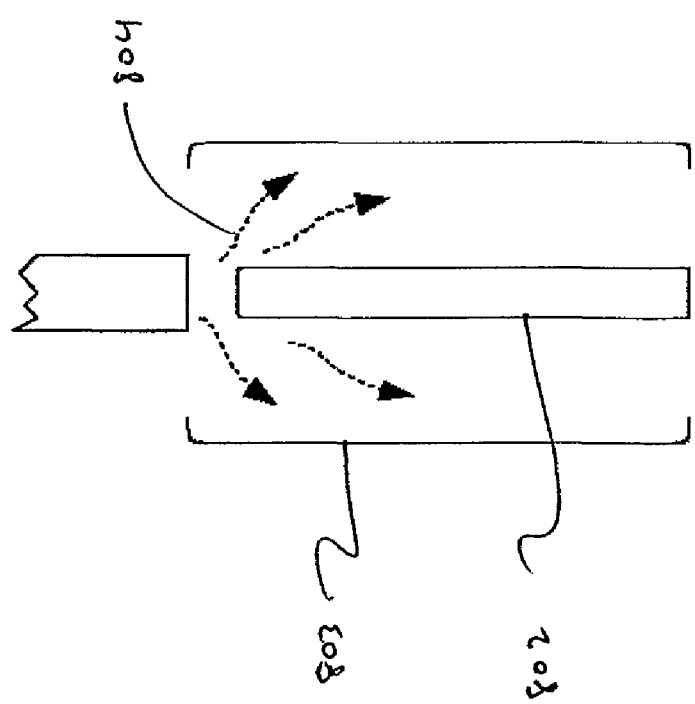
FIG. 8 is a schematic showing an alternate CVD apparatus suitable for use in practicing the invention.

An alternate embodiment that may be used to form rings is shown in FIG. 8. In this embodiment, a rod 802 is disposed within the cylindrical tube 803, and material, represented by arrows 804, is caused to deposit both on the inner surface of the tube as well as on the outer surface of the rod. This configuration may be used to produce differently sized tubular CVD material deposits, and subsequently produce two differently-sized rings; one ring that corresponds to the inner diameter of the cylinder and another ring that corresponds to the outer diameter of the rod.

Another alternative embodiment relates to the formation of differently sized rings by depositing CVD SiC onto the inner and outer surfaces of a tube disposed within the reactor, again giving two differently sized tubes, which can then be cut to different diameter annular rings. These embodiments are particularly suited to prepare rings suitable as wafer supports in semiconductor furnaces, and in other applications where different sized rings are desirable and/or necessary. Another benefit to these techniques for producing rings is that they result in matched sets of rings from the same deposition process, and containing the same material. This is desirable when qualifying new materials for use in expensive semiconductor processing apparatus, since only one material produced by a single process is being qualified.

Rings sliced from cylindrical deposits of this invention are easier to machine than rings made using the methods of the prior art due to the lower internal or out-of-plane stresses around the ring. Generally, as material is deposited via CVD, there are subtle but unintentional variations in the process parameters that can affect the nature of the material and the crystal growth structure can vary, creating inherent stresses in the material. These stresses can cause bowing or bending in rings that are cut out of a sheet of material with the predominant direction of crystal growth in the direction normal to the plane of the sheet. By contrast, the symmetry provided by using a cylindrical tube mandrel or support according to the invention affords a substantially symmetrical stress gradient around the ring, so that any inherent stress exhibited on one side of the ring is balanced by a similar inherent stress on the opposite side of the ring (i.e., there is no net stress in the plane of the ring). In other words, the inherent stress is directed inwards or outwards in a similar manner, affecting the ring or disk in a substantially symmetrical way.

For SiC that is deposited upon a flat surface, the stress gradient on the lower surface 44 will be different from the stress gradient on the upper surface 46 due to the way the ring is manufactured. This difference in stress gradient can cause the material to bend or bow, preventing the manufacture of a flat ring.

By contrast, for SiC that is deposited within a cylindrical tube, the stress gradient difference is exhibited between the outer surface 48 and in the inner surface 50, as shown in FIGS. 6 and 7, such that any stress gradient "squeezes" the ring symmetrically. Accordingly, rings that are cut from the resulting cylindrical deposition have substantially uniform properties around them due to the uniformity of the deposition parameters across that particular slice. (However, it is possible that properties of slices cut from different positions along the cylinder will be slightly different due to the different deposition parameters along the particular length of the cylinder.)

If the cylindrical tube 20 is provided as a series of sections, the deposit can be removed by disassembling the sections. Even if the resulting deposit fractures or cracks, the cracked areas do not cause a great deal of wasted material because they will typically be across the diameter of the material due to the microcrystalline structure of the material. This is the portion of the ring that will be machined during cutting or slicing.

Figure 5:
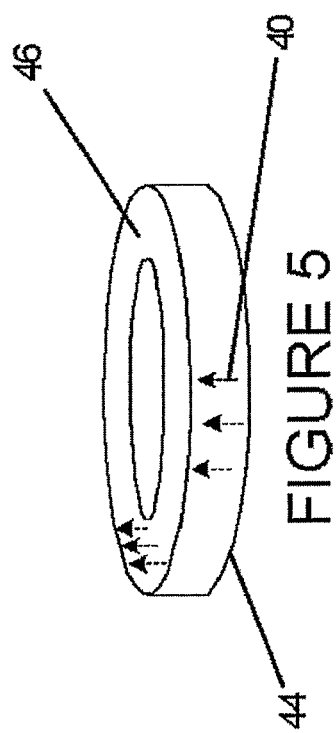
FIG. 5 is a schematic view showing the crystal growth of a ring formed by the methods of the prior art.

During the prior art deposition process (whether the ring is formed from a flat sheet or on a ring shaped mandrel), the growth direction of the crystal structure is in the direction of the height 40 of the ring, as shown in FIG. 5. This is the case whether the deposit is formed on a flat graphite sheet, on a series circular mandrels mounted on a shaft, or on graphite rings suspended in the chamber.

However, rings according to the present invention exhibit the growth direction of the crystal structure in the direction of the length 42 or diameter of the ring, as shown in FIGS. 6 and 7. In other words, the crystal growth forms on the inside of the cylindrical tube 20 and extends inward in a substantially radial maimer. When the resulting cylindrical deposit that is formed is removed from the tube, it will have a long axis and a circumference. The growth of the crystal grain is around the radial circumference and perpendicular to the long axis. Once the cylindrical deposit is sliced or cut into individual rings, the grains are oriented in the plane of the finished article. This is directly contrary to the crystal growth seen in rings that are manufactured using traditional methods.

Figure 11:
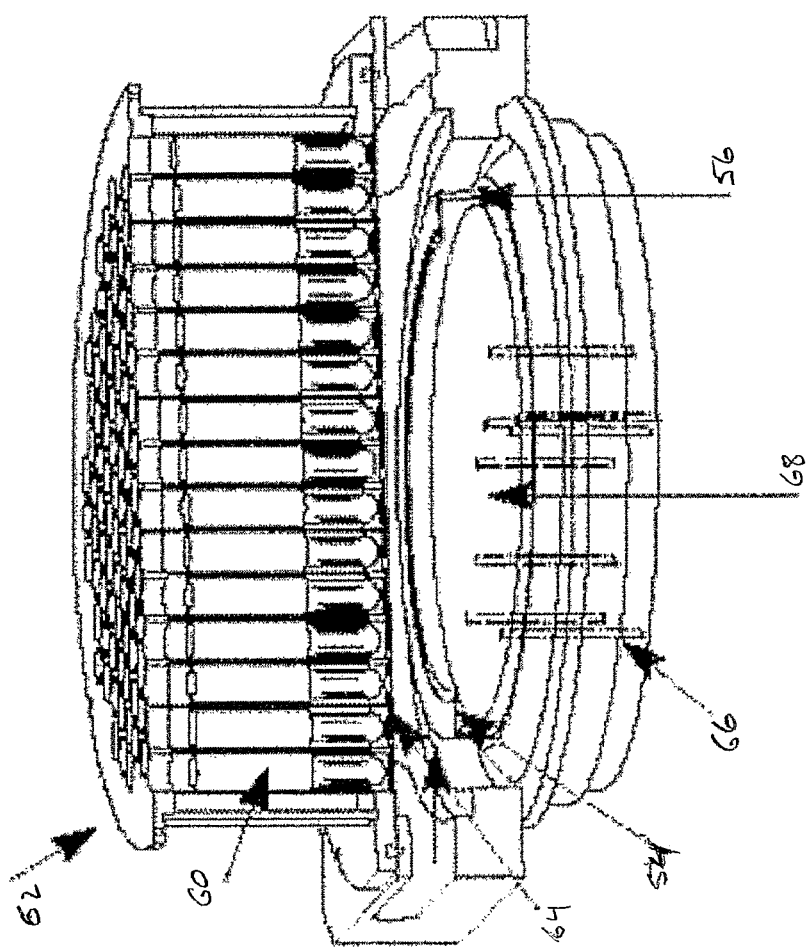
FIG. 11 is a schematic diagram of a rapid thermal processing apparatus for semiconductor wafers using rings prepared according to one embodiment of this invention.
Figure 12:
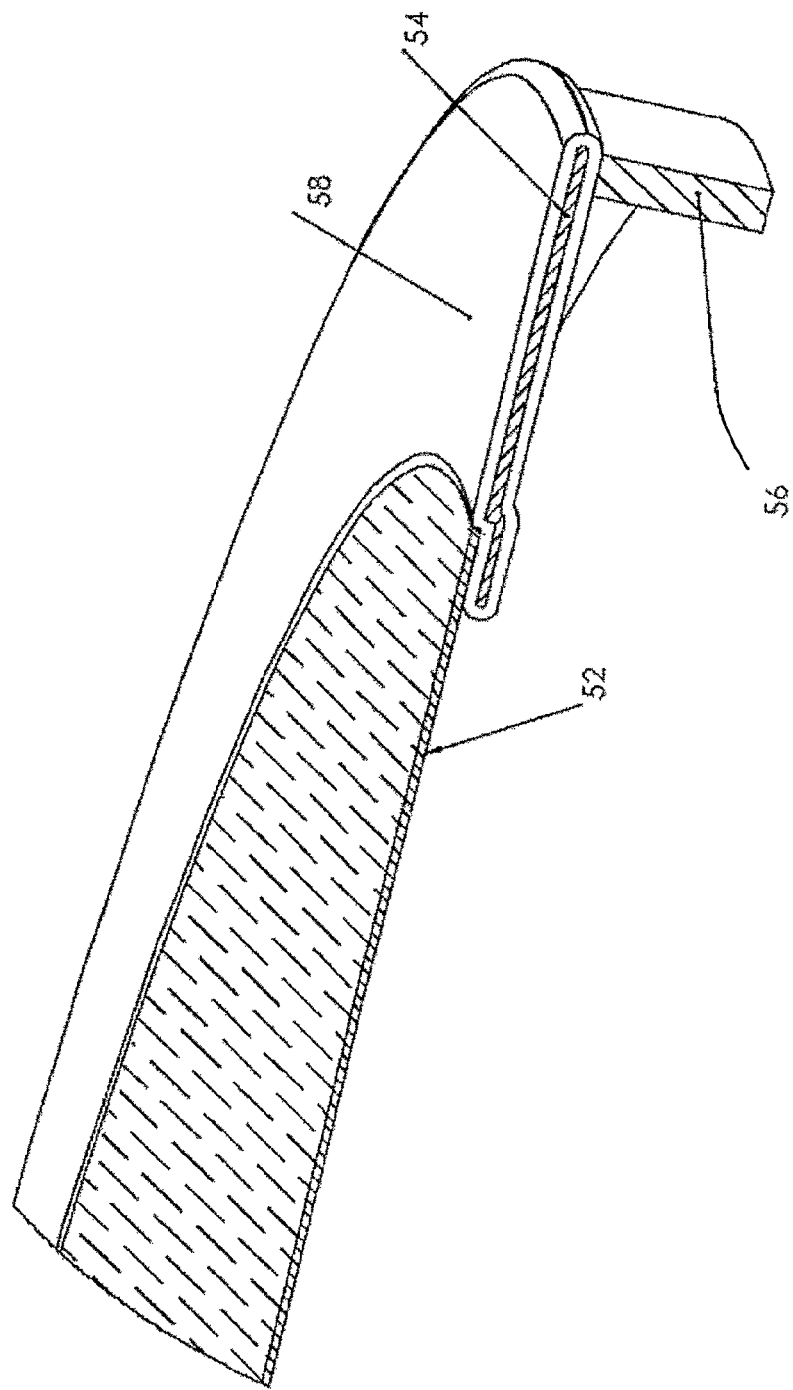
FIG. 12 is a cross-sectional diagram illustrating an edge ring of the rapid thermal processing apparatus of FIG. 11.

This can be seen more clearly by reference to FIGS. 12, 13, 14, 15 and 16, which illustrate the microstructural differences observed in edge rings machined from CVD SiC prepared by the process of the invention and by the conventional prior art processes. FIG. 12 provides context by showing what an edge ring is, and how it is used. FIG. 12 is a cross-sectional diagram of several elements of the rapid thermal processing system shown in FIG. 11, in which silicon wafer 52 is held at the outer diameter by edge ring 54 mounted horizontally on top of one end of vertical support cylinder 56. Edge ring 54 may comprise a CVD SiC ring which may optionally be coated with silicon layer 58. Edge ring 54 may be machined with a recess to hold the wafer as shown in FIG. 12. Ring 54 may be incorporate other geometrical features (not shown) depending on the specifics of the design criteria.

Figure 13:
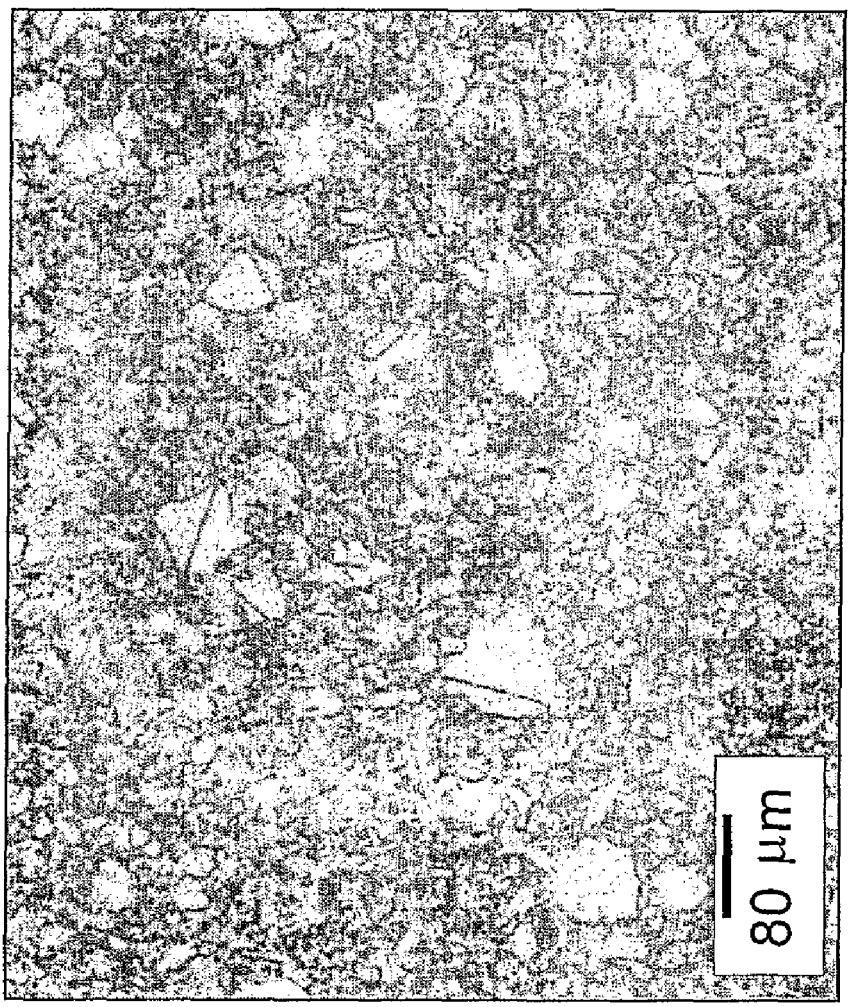
FIG. 13 is a micrograph of the microstructure of a prior art CVD SiC ring, with observation perpendicular to the plane of the ring.

FIG. 13 is a top-down view optical micrograph of the microstructure of a prior art CVD SiC ring, with observation perpendicular to the plane of the ring. This ring was prepared from a sheet of CVD SiC manufactured by the prior art process of Example 1. The specimen was etched to reveal the grain structure within the SiC material. The orientation of the SiC grains is random within the plane of the ring.

Figure 14B:
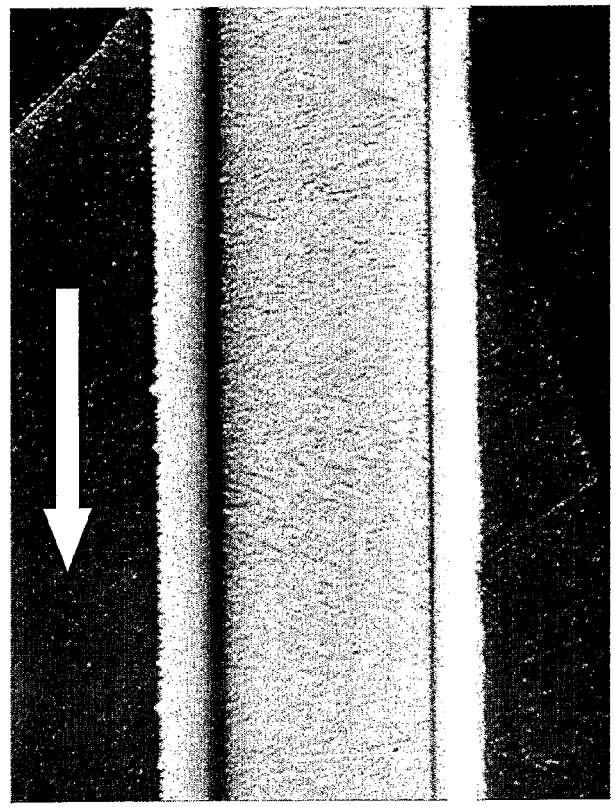
FIGS. 14a and 14b display comparable micrographs showing the microstructure of prior art Si-coated CVD SiC edge rings manufactured from standard prior art sheet-form CVD SiC.
Figure 14A:
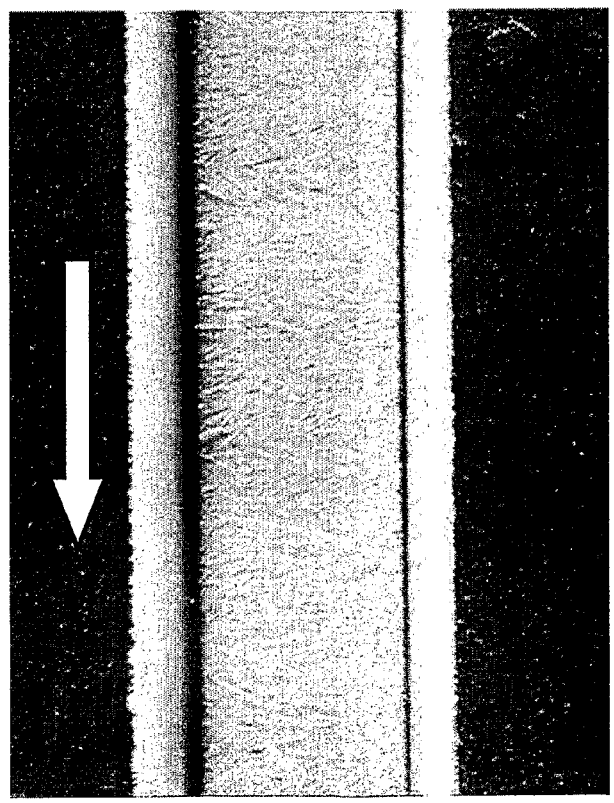

FIGS. 14a and 14b are 50× magnification optical micrographs obtained from metallographic cross-sections of a prior art CVD SiC edge ring that was coated on both sides with CVD Silicon, corresponding to the horizontal flat sections of FIG. 12. The specimen was not etched, but the image was taken with polarized light to accentuate the grain structure within the CVD SiC material. The CVD SiC material was produced by the process of Example 1. The arrows indicate the direction parallel to the plane of the ring, pointing from the outer diameter toward the inner diameter of the ring. The vertical orientation of the long axis of the SiC grains is clearly visible, which clearly shows that the direction of growth of the SiC grains is perpendicular to the plane of the ring.

Figure 15:
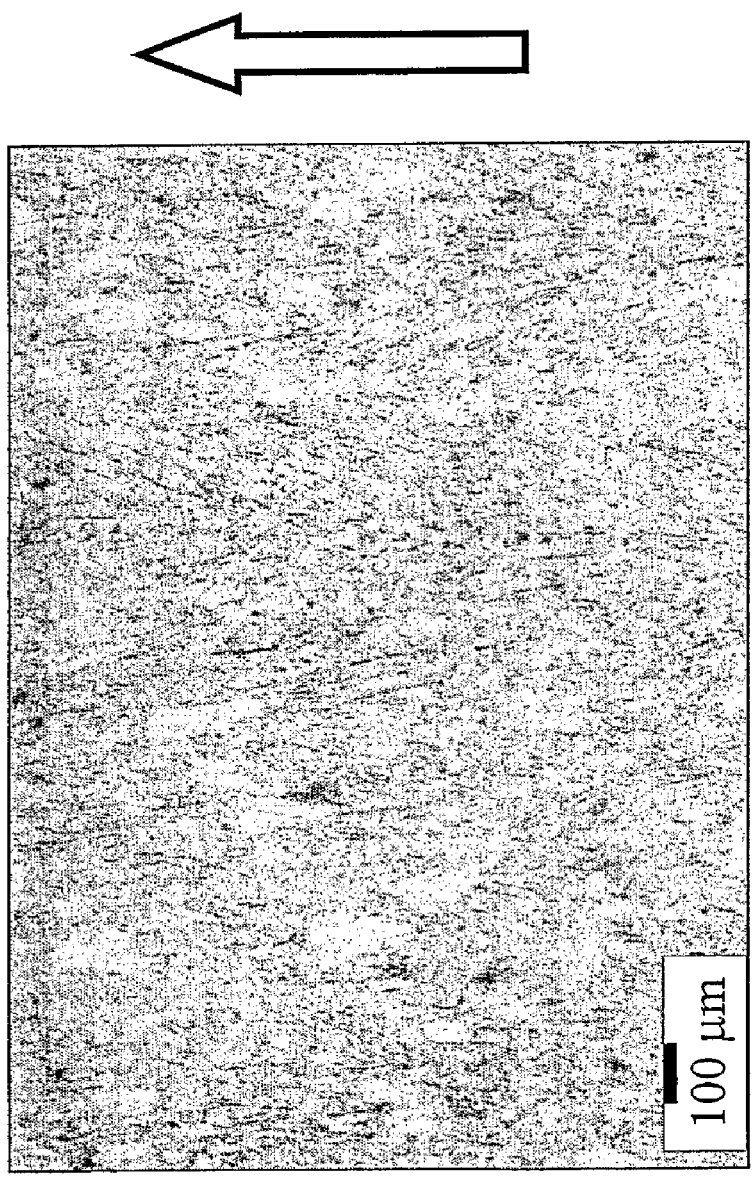
FIG. 15 is a micrograph of the microstructure of a CVD SiC ring of the present invention, with observation perpendicular to the plane of the ring.

FIG. 15 is a top-down view optical micrograph of the microstructure of a CVD SiC ring of the present invention, with observation perpendicular to the plane of the ring. The ring was sliced from a CVD SiC tube prepared by the process of Example 2 of the present invention. The specimen was etched to reveal the grain structure within the SiC material. The arrow shows the direction parallel to the plane of the ring, pointing from the outer diameter toward the inner diameter of the ring. This micrograph clearly shows that the SiC grains are oriented parallel to the plane of the ring. It is also observed that the grains are oriented along the radius of the ring. This grain structure is in sharp contrast with the microstructure of prior art CVD SiC rings shown in FIG. 13.

FIGS. 16a, 16b, 16c and 16d are 50× magnification optical micrographs obtained from metallographic cross-sections of a CVD SiC edge rings of the present invention that were coated on both sides with CVD Silicon, corresponding to the horizontal flat sections of FIG. 12. The specimens in FIGS. 16a, 16b and 16c were not etched, but the images were taken with polarized light to accentuate the grain structure within the CVD SiC material. The specimen in FIG. 16d was etched in a dilute mixture of hydrofluoric acid and nitric acid to reveal the microstructure of the CVD Si coating. The CVD SiC material was produced by the process of Example 2. The arrows indicate the direction parallel to the plane of the ring, pointing from the outer diameter toward the inner diameter of the ring. Note the horizontal orientation of the long axis of the SiC grains, which clearly shows that the direction of growth of the SiC grains is parallel to the plane of the ring. This grain structure is in sharp contrast to the microstructure of the prior art SiC ring shown in FIG. 14. FIG. 16d clearly shows that the direction of growth of grains within the CVD Silicon coating is perpendicular to the plane of the ring, and perpendicular to the direction of the SiC grains as well.

Measurements of the grain size and grain aspect ratio were obtained for various samples of rings obtained from Example 2. Only grains having a dimension of greater than 10 μm were measured. These grains exhibited aspect ratios ranging from about 2 to about 10, more typically about 3 to about 6. The photomicrograph in FIG. 15 shows that the grains are highly oriented in the plane of the ring, but are otherwise randomly oriented. In other words, the grains line up so that their long axes are substantially parallel to the ring plane. However, the grains themselves exhibit rotational orientation that is substantially random with respect to the direction of grain growth. Without wishing to be bound by any theory, it is believed that this combination of radial, planar orientation of grain growth axis and substantially random orientation of the grains with respect to the grain growth axis is what provides the benefits of symmetrical stress distribution described above, and also avoids fluctuations in the surface profile of the rings.

In one embodiment of the method of the present invention, free-standing silicon carbide tubes from which the rings are sliced are deposited from a mixture of silicon carbide precursor gases, such as a mixture of methyltrichlorosilane (MTS) and hydrogen, with an optional inert gas, such as argon or helium and optional dopant gas into a deposition chamber heated to a temperature typically between 1300° C. and 1400° C. Deposition pressure is maintained at approximately 100 torr to 300 torr. The relative partial pressure flow ratio of hydrogen to MTS is maintained in the range of approximately 5 to 10.

Reaction gases are delivered into a tubular mandrel through a single injector or an array of injectors positioned symmetrically at either the top or bottom. Under these conditions, silicon carbide is deposited on the inside of the tubular mandrel(s) at a deposition rate of approximately 1 to 3 μm/minute and the deposition process is continued until the desired thickness of SiC material is achieved. Typical deposition periods vary between 50 and 300 hours.

Upon completion of the deposition, the mandrel and deposit are removed from the reaction chamber and with or without first separating the mandrel from the deposited material, the silicon carbide rings are sliced from the tube. The outer and inner dimensions and the thickness of the ring are then machined to specification using diamond grinding methods.

The unique characteristics of the products of the present invention, i.e. low in-plane residual stress, extreme flatness, high control of machinability, allow for the manufacture of very thin (e.g. less than 0.5 inch) hoop-shaped rings, and more complicated rings with or without bulk "drop-offs."

The process according to the invention can also be adapted to provide extremely opaque wafer support rings. As shown in FIG. 11, wafer support rings support a Si wafer in a rapid thermal processing reactor where the wafer is heated from above to relative high, but highly controlled, temperatures. In order to control temperature effectively, accurate pyrometery measurements are very important. The Si wafer is illuminated from above by tungsten halogen lamps 60, disposed in light pipes in a water cooled housing 62. Light passes through quartz window 64 and onto the Si wafer. Because standard CVD SiC rings have different optical characteristics from those of the Si wafer, pyrometry observations, which are taken from below the wafer by fiber optic probes 66 and reflector plate 68, can be corrupted by light leakage through the edge rings 54, which are supported by cylindrical support 56. Accordingly, there is a desire to produce support rings with an opacity similar to that of the Si wafer. This can be done by coating the SiC rings with a relatively thick (75-100 micron) layer of Si.

However, another solution to increasing opacity of the rings is to dope the CVD SiC with a suitable dopant. One such dopant is nitrogen in amounts ranging from about 100 to about 5000 ppm. The nitrogen gas is simply added to the gas mixture during deposition of the rings, as described above. This process increases opacity of the rings by a factor of approximately 10,000 to 10,000,000 times, producing a SiC material that is considerably closer to Si in optical transmission properties, and reducing light leakage, thereby reducing the need for coating with a Si layer. Another suitable dopant is boron.

EXAMPLES

Using the process of the present invention, 200 mm and 300 mm diameter SiC edge rings for Si wafer processing have been produced and characterized. Rings were made from both electrically non-conducting CVD-deposited SiC material exhibiting a typical electrical resistivity of about 100 to 10,000 ohm-cm, and electrically conductive SiC with an electrical resistivity of less than 0.01 ohm-cm.

Figure 9:
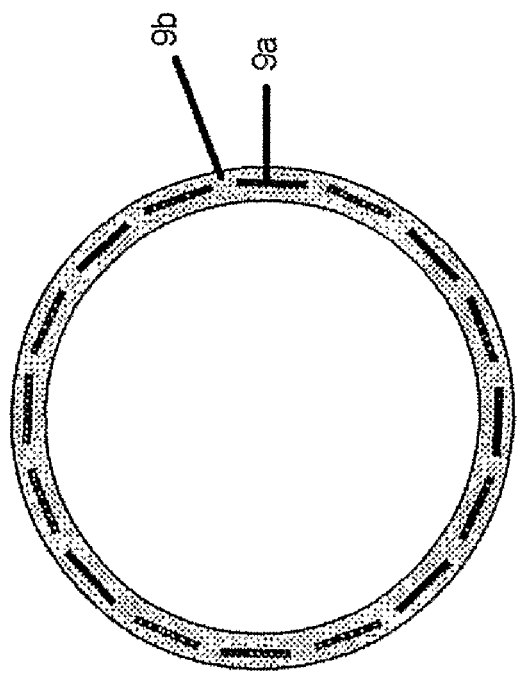
FIG. 9 is a schematic showing SiC ring blanks used to prepare bars for MOR testing.

In the following Examples, flexural strength measurements, also known as modulus of rupture (MOR) tests, on the deposited SiC materials were obtained using the 4-point bend test according to ASTM C-1161. The MOR test samples (bars) were cut from rings sliced from the deposited cylinders. The MOR bar samples had the following dimensions: length of 45 mm, width of 4±0.13 mm, thickness of 3±0.13 mm, edge chamfer of 0.12±0.03 mm at an angle of 45°±5°. Chamfers were fabricated by grinding with a 600-grit grinding wheel, while the large planar sides of the MOR bars were finished with a 320-grit wheel, The approximate layout of the MOR bars 9a cut from the SiC ring blank 9b is shown in FIG. 9. The 44 mm×4 mm side of the MOR bar was obtained from the plane of the ring.

Electrical resistivity measurements were made with a Jandel Company hand held 4-point probe, consisting of a linear array of 4 points spaced 1 mm apart. The resistivity was calculated assuming an infinite material thickness. Three data sets were obtained at each of four measured positions on each sample ring.

Example 1

Comparative

SiC rings were fabricated as follows. A graphite box of size approximately 15 inches×15 inches×50 inches was formed from four isostatically pressed, fine grained graphite plates having a thermal expansion similar to that of dense CVD SiC was assembled and installed in a CVD reactor.

Deposition gases hydrogen and MTS were introduced through an injector positioned at the top of the box assembly at a ratio of hydrogen-to-MTS approximately 8, and a pressure of 200 torr. Chemical vapor deposition of SiC was carried out at approximately 1350° C. The total deposition time was approximately 200 hours, with a typical deposition rate of the SiC material of 0.002 inch per hour.

After deposition, the reaction chamber was opened and the sheet SiC deposits were removed. Each of the sheet SiC deposits was cut into ring blanks having a thickness of approximately 0.2 inch. These slices were then ground to the final ring specification.

The SiC material deposited by this technique had the following typical values: a density of 3.21 g cm$^{-3}$, Vickers hardness >2700 kg mm$^{-2}$, thermal conductivity of 250 Wm$^{-1}$K$^{-1}$, electrical resistivity between 100-10,000 ohm-cm, and flexural strength in the range of 45 to 70 ksi (310 to 480 MPa).

Example 2

SiC edge rings for handling 300 mm Si wafers for semiconductor processing were fabricated as follows. A graphite tube with nominal inner diameter of 340 mm was manufactured from an isostatically pressed, fine grained grade of graphite with a thermal expansion similar to that of dense CVD SiC. Four tubular sections, each with a length of approximately 13 inches were assembled in a CVD reactor. Optional deposition-prohibiting spacer devices were positioned in between each section to facilitate removal of each tubular section after deposition.

The precursor gas MTS was introduced through a single injector positioned symmetrically at the top of the tubular mandrel assembly at a flow rate of 9.1 liters per minute. Hydrogen was delivered through the same injector at a flow rate of 76 liters per minute. The ratio of hydrogen-to-MTS was 8.4. The CVD reactor pressure was 200 torr and deposition temperature was 1350° C. The total deposition time was 174 hours, and the average deposition rate of the SiC material was 0.005 inch per hour.

After deposition, the reaction chamber was opened and the tubular mandrels, spacer devices and tubular SiC deposits were removed. Each of the tubular SiC deposits was then sliced using a diamond abrasive slitting wheel into ring slices having a thickness of approximately 0.2 inch. These slices were then ground to the final edge ring specification.

The SiC material deposited by this technique had a density of 3.21 g cm$^{-3}$, Vickers hardness >2700 kg mm$^{-2}$ and thermal conductivity between 240 and 270 Wm$^{-1}$K$^{-1}$, and an electrical resistivity between 390 and 450 ohm-cm. These measurements are in the same range as Jandel probe resistivity measurements obtained from plate-form SiC material that has been deposited under similar conditions, but on flat graphite sheets.

The flexural strength of rings obtained by this process varied between 40 and 65 ksi (275 to 450 MPa), depending upon where the ring was sliced from the tubular deposit. FIG. 10 presents bright field optical micrographs of an etched sample obtained from a ring which exhibited a flexural strength of 62 ksi. The lower portion of FIG. 10(a) is the outer diameter of the ring slice, which is part of the deposit that was next to the graphite mandrel substrate. The upper portion of FIG. 10(b) shows a portion of the deposited material taken from a point 13.2 mm from the substrate, i.e. the SiC deposit was 13.2 mm thick. The increase in grain size within the SiC deposit as the distance from the substrate is increased is clearly noticeable, as is the orientation of the grains as illustrated in FIG. 6.

That the rings of the present invention with a SiC grain growth orientation parallel to the plane of the ring had a flexural strength equal to that of rings made from SiC material with grain growth orientation perpendicular to the plane of the ring was surprising. This excellent result was unexpected since in the flexural strength test of the material of the present invention, the SiC material is bent in a direction parallel to the direction of grain growth, i.e. using an analogy to wood, the material is bent "along the direction of the grain." Therefore, the present invention overcomes prior art deficiencies associated with fabrication of ceramic rings, while maintaining outstanding material strength.

Example 3

SiC edge rings for handling 200 mm Si wafers for semiconductor processing were fabricated according to the process of Example 1, with the following exceptions: the graphite tube had a nominal inner diameter of 240 mm, each tubular graphite section had a length of approximately 9 inches, and the hydrogen-to-MTS flow ratio was 7.4. The average deposition rate was 0.0051 inch per hour. The flexural strength of rings obtained varied between 57 and 68 ksi (390 to 465 MPa), again indicating outstanding material strength.

Example 4

SiC edge rings for handling 200 mm Si wafers for semiconductor processing were fabricated according to the process of Example 2, with the following exceptions: each tubular graphite section had a length of approximately 8.5 inches, and the hydrogen-to-MTS flow ratio was 8.4 and a nitrogen doping gas was added to produce an electrically conducting SiC deposit. The average deposition rate was 0.0065 inch per hour. Rings obtained varied in electrical resistivity from 0.004 ohm-cm to 0.007 ohm-cm. For comparison, SiC material deposited in plate form that has been deposited under similar conditions onto flat graphite shee typically exhibits a resistivity between 0.002 ohm-cm and 0.008 ohm-cm. Therefore, the electrical resistivity measurements obtained from the deposit in Example 4 are similar to measurements obtained from plate-form SiC material deposited under similar conditions.

Representative rings from the prior examples have been coated with CVD silicon coatings to reduce opacity to light and to provide a high purity Si surface for contact to Si wafers during wafer processing. Typically, this deposition is conducted at or near atmospheric pressure using trichlorosilane as a source of silicon plus hydrogen as a diluent and reaction catalyst gas and a CVD temperature of between about 1000° C. and 1200° C. Other vacuum deposition and vapor deposition methods including but not limited to evaporation, sputtering, ion plating, ion beam deposition and plasma deposition can be used to deposit coatings over the products of the present invention. Because of the orientation and uniform nature of the microstructure of the material of the present invention, coatings applied to the products of the present invention have improved cosmetic appearance compared with coatings applied to prior art CVD products, e.g. the CVD Si-coated SiC rings of the present invention do not display variation in cosmetic appearance, as further explained below.

The microstructure of SiC rings made from the standard "sheet" SiC material (using conditions similar to Example 1) and the process of the present invention (Example 2), and the effect of the microstructure of these materials on the structure and appearance of deposited Si coatings were evaluated. The materials were characterized by optical microscopy and X-ray diffraction (XRD). X-ray diffraction measurements were performed with the x-ray beam incident on the large flat planar surface of the ring samples.

Measurement of Si coating structure was performed by plane-view optical microscopy examination at 100×-200× magnification. XRD texture analysis was performed on a Philips X'Pert MPD diffractometer that was set up with parallel beam optics using Cu radiation operating at 45 kV and 40 mA. Tests were run over the angular range of 25 degrees to 90 degrees to capture all of the principal diffraction peaks from SiC and Si.

For the XRD analysis of each sample, the Si top layer was scanned first to obtain the texture of the Si layer. Then, the Si coating was completely removed by immersing the sample in a 5% solution of hydrofluoric acid in nitric acid for 1.5 hours. Then, a second scan of the underlying SiC ring substrate was obtained. In this way, XRD data was obtained on the Si coating and the SiC substrate from the same location on the part.

Several Si-coated CVD SiC rings were chosen for analysis based on the method of manufacturing and the cosmetic appearance of the Si coating. The samples and analysis results are presented in Table 1, wherein Sample ring 80C2-01 was obtained from a ring made by the process of Example 2 of the present invention, and Samples 45CN113 and 67CN463 were made from sheet form CVD SiC by processes similar to Example 1. There was no variation in cosmetic appearance of any areas of Sample 80C2-01, therefore Sample 80C2-01-4 is representative of the entire ring. However, samples 45CN113-1 and 45CN113-2 were two samples cut from different areas of the same ring with different cosmetic appearance. Sample 45CN113-2 was taken from an area of the ring that exhibited a uniform appearance, and Sample 45CN113-1 was taken from an area of the ring that exhibited a non-uniform appearance. Likewise, Samples 67CN463-4 and 67CN463-5 were two samples cut from areas of the same ring with different cosmetic appearance. In this case, Sample 67CN463-4 appeared slightly non-uniform, and Sample 67CN463-5 was very non-uniform. The following discussion illustrates the relationship between the uniformity of cosmetic appearance of the silicon coating and the 220/111 peak ratios obtained from x-ray diffraction measurements of the underlying SiC material for these samples.

TABLE 1

| Sample No. | Process | SiC 200/111 | SiC 220/111 | SiC 311/111 | Si Coating Appearance |
| --- | --- | --- | --- | --- | --- |
| PDF database | | 0.20 | 0.35 | 0.25 | N/A |
| 80C201-4 | Example 2 | 0.17 | 0.39 | 0.23 | uniform gray appearance in reflected light |
| 45CN113-2 | Similar to Example 1 | 0.10 | 0.82 | 0.27 | uniform gray appearance in reflected light |
| 45CN113-1 | Similar to Example 1 | 0 | 17.6 | 0.4 | strongly variable appearance in reflected light |
| 67CN463-4 | Similar to Example 1 | 0.84 | 1.26 | 0.25 | slightly variable appearance in reflected light |
| 67CN463-5 | Similar to Example 1 | 0.2 | 27.2 | 0.4 | strongly variable appearance in reflected light |

The XRD texture was essentially the same for all of the Si coatings on the samples in Table 1. By comparison with the powder diffraction pattern database, all coatings were the cubic phase of silicon. Each spectrum showed an extremely strong 220 preferred orientation, although some of the other Si peaks were barely visible at levels less than 1%.

Table 1 also presents the XRD texture results from the same samples. By comparison with the powder diffraction pattern database, the SiC structure for all samples was the face-centered cubic phase Moissanite-3C SiC structure. According to the powder diffraction pattern database, the ratio of SiC 220 to SiC 111 of approximately 1:3 is indicative of a randomly oriented SiC material of the Moissanite-3C structure. Sample 80C201-4 of the present invention is seen to have a completely random XRD texture, virtually identical to the powder diffraction database pattern, while the other samples displayed either a minor preferred or a significant preferred 220 orientation. Sample 45CN-113-2 was almost random with a slight 220 oriented component, while the texture in sample 45CN113-1 is strongly 220 oriented. Sample 67CN463-4 exhibited a preferred 220 orientation with a significant random component, whereas the texture of Sample 67CN463-5 was very strongly 220 oriented.

There is an apparent relationship between the 220/111 peak ratios of the SiC materials obtained by x-ray diffraction measurements and the cosmetic appearance of the Si coating. The low 220/111 ratio for Sample 80C2-01-4 is consistent across the ring, resulting in a highly uniform Si coating appearance. By contrast, the higher and variable 220/111 peak ratios obtained from the prior art samples of ring 45CN133 and 67CN463 results in a non-uniform appearance of the Si coating.

Observations of the silicon coated surfaces indicated that a preferred 220 XRD texture in the SiC material leads to the growth of larger grains in the CVD Si coating. The reason for this is not understood, but may be due to the close lattice match between 220 Si and 220 SiC. Variation in the degree of 220 orientation on different locations of the SiC ring leads to variation in the crystal size of the deposited CVD Si coating, resulting in a non-uniform appearance in reflected light. The SiC ring made by the process of the present invention displays a randomly oriented texture which results in a CVD Si coating of highly uniform appearance.

The inventors also believe that improved cosmetic appearance with the SiC rings of the present invention may be due to the almost perpendicular orientation of the grains in the Si coating compared to the SiC grains in the ring material. This is in sharp contrast to prior art processes in which the grain structure of the Si coating is oriented in the same direction as the grain structure of the SiC ring material.

It has also been observed that the SiC rings of the present invention have improved optical opacity compared to prior art CVD SiC rings. It is believed this improved opacity may also be related to the random orientation of the crystal structure in the plane of the ring compared to the preferred 220 orientation of prior art CVD SiC ring materials.

In addition to the excellent material properties summarized above, additional unexpected benefits have been found with regard to processing the materials of the present invention. In addition to providing materials having better stress distributions and flatter profiles, the method of the present invention also increases manufacturing capacity significantly by allowing multiple cylindrical deposition chambers inside one CVD furnace, replacing at least one of the conventional squared-sectioned box sites or flat mandrels with at least one cylindrical tube. In addition, other time and cost savings are realized by use of the process of the invention.

First, when compared to fabrication of rings from plate-form CVD SiC material, the fabrication time of product of the present invention is significantly less. Typical fabrication, i.e. cutting or slicing the ring from the deposit, then grinding to final dimensions, is reduced by approximately 35%.

Also, because the rings are flat as sliced from the tubular deposit, grinding to the specified ring flatness of 0.002 inch can be achieved on the first attempt with the product of the present invention. In contrast, plate-form deposited SiC material has a characteristic bow that must be machined out to achieve a final flat part. Multiple processes of alternate side grinding are required with plate-form SiC, and the first grinds are outside of flatness specification be several thousandths of an inch.

It has also been surprisingly found that the process of the present invention produces a material that is very uniform and provides consistent results during grinding, when compared to plate-form material. The plate-form SiC material is often inconsistent in thickness and uniformity across the dimension of a ring, and requires significant machine operator judgment and adjustment to produce finished parts within the desired product specifications. In addition, it is believed that the non-uniform machining of the plate-form material can induce unwanted stresses. Because of the uniform microstructure in the axial direction, and because of the grain orientation of the present invention, the material grinding to final configuration is much more consistent.

Although the specific examples presented above are for CVD silicon carbide materials, similar results are anticipated with other materials that can be deposited by CVD including, but not limited to other oxide, nitride and carbide ceramic materials such as aluminum oxide, aluminum nitride, aluminum oxy-nitride, silicon oxide, silicon nitride, silicon oxy-nitride, boron nitride, boron carbide, and other materials such as zinc sulfide, zinc selenide, silicon and diamond.

What is claimed is:

1. A structure formed by chemical vapor deposition, being a planar article having a planar direction and a normal direction, wherein the structure has a dimension in the planar direction that is larger than the dimension in the normal dimension and having grains substantially oriented in the planar direction, wherein the structure comprises silicon carbide.

2. A structure, as claimed in claim 1, wherein the structure is a flat ring having a circumference and wherein the grains are oriented in a substantially radial direction around the circumference of the ring.

3. A structure, as claimed in claim 1, having an axial thickness of less than 5 mm (0.2 inches) and a diameter of up to 356 mm (fourteen inches).

4. A structure, as claimed in claim 1, wherein the structure is a flat ring that has a curved outer surface.

5. A structure, as claimed in claim 1, wherein the structure is a flat ring having a circumference that has substantially symmetrical stresses around the circumference of the ring.

6. A structure, as claimed in claim 1, in which the structure comprises CVD deposited silicon carbide comprising an opacifying dopant dispersed in the silicon carbide in an amount sufficient to provide an opacity greater than 10,000 times that of CVD-deposited silicon carbide.

7. A structure, as claimed in claim 6, in which the dopant is nitrogen in an amount 100 ppm to about 5000 ppm.

8. A structure, as claimed in claim 1, in which the structure comprises CVD deposited silicon carbide material comprising FCC Moissanite-3C silicon carbide having a peak ratio of 220 planes to 111 planes ranging between about 0.30 and about 1.25, as measured by x-ray diffraction.

9. A structure, as claimed in claim 8, in which the peak ratio ranges between about 0.33 and about 0.60.

10. A structure, as claimed in claim 1, in which the structure comprises CVD deposited silicon carbide material comprising grains having their axes of growth substantially parallel to each other, and having rotational orientation that is substantially random with respect to the axes of grain growth of the grains.

11. A structure, as claimed in claim 1, in which the structure comprises silicon carbide and further comprises a layer of silicon deposited on at least one surface thereof.

12. A structure formed by chemical vapor deposition, being a planar article having a planar direction and a normal direction, wherein the structure has a dimension in the planar direction that is larger than the dimension in the normal dimension and having grains substantially oriented in the planar direction, wherein the structure is a ring that comprises an inner diameter and an outer diameter and wherein the distance between the inner diameter and outer diameter is approximately 25 mm (one inch).

13. A structure, as claimed in claim 12, wherein the inner diameter is between about 100 mm to 600 mm in diameter.

14. A structure formed by chemical vapor deposition, being a planar article having a planar direction and a normal direction, wherein the structure has a dimension in the planar direction that is larger than the dimension in the normal dimension, wherein the structure is cut from a CVD-formed tube of material such that it has grains substantially oriented in the planar direction of the article, wherein the structure comprises silicon carbide.

15. The structure of claim 14, wherein the structure is a flat ring having a circumference and wherein the grains are oriented in a substantially radial direction around the circumference of the ring.

* * * * *